United States Patent
Tran et al.

(10) Patent No.: US 7,001,840 B1
(45) Date of Patent: Feb. 21, 2006

(54) INTERCONNECT WITH MULTIPLE LAYERS OF CONDUCTIVE MATERIAL WITH GRAIN BOUNDARY BETWEEN THE LAYERS

(75) Inventors: Minh Quoc Tran, Milpitas, CA (US); Lu You, San Jose, CA (US); Fei Wang, San Jose, CA (US); Lynne Okada, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 80 days.

(21) Appl. No.: 10/361,332

(22) Filed: Feb. 10, 2003

(51) Int. Cl.
H01L 21/44 (2006.01)

(52) U.S. Cl. ............................................... 438/652
(58) Field of Classification Search ............. 438/629, 438/637, 663, 660, 652
See application file for complete search history.

(56) References Cited

U.S. PATENT DOCUMENTS 6,753,251 B1 * 6/2004 Ritzdorf et al. ............. 438/638
6,825,120 B1 * 11/2004 Liu et al. .................... 438/693

* cited by examiner

Primary Examiner—S. V. Clark
(74) Attorney, Agent, or Firm—Monica H. Choi

(57) ABSTRACT

An interconnect structure is formed with a plurality of layers of a conductive material with a grain boundary between any two adjacent layers of the conductive material. Such grain boundaries between layers of conductive material act as shunt by-pass paths for migration of atoms of the conductive material to minimize migration of atoms of the conductive material along the interface between a dielectric passivation or capping layer and the interconnect structure. When the interconnect structure is a via structure, each of the layers of the conductive material and each of the grain boundary are formed to be perpendicular to a direction of current flow through the via structure. Such grain boundaries formed between the plurality of layers of conductive material in the via structure minimize charge carrier wind-force along the direction of current flow through the via structure to further minimize electromigration failure of the via structure.

14 Claims, 9 Drawing Sheets

US 7,001,840 B1

INTERCONNECT WITH MULTIPLE LAYERS OF CONDUCTIVE MATERIAL WITH GRAIN BOUNDARY BETWEEN THE LAYERS

TECHNICAL FIELD

The present invention relates generally to interconnect technology in integrated circuit fabrication, and more particularly, to forming an interconnect structure with multiple layers of conductive material with a grain boundary formed between any two adjacent layers for minimizing electromigration failure of the interconnect structure.

BACKGROUND OF THE INVENTION

Common components of a monolithic IC (integrated circuit) include interconnect structures such as metal line structures and via structures for electrically connecting integrated circuit devices formed on a semiconductor substrate, as known to one of ordinary skill in the art of integrated circuit fabrication. A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

However, copper cannot be easily patterned in a deposition and etch process, and thus, copper interconnect structures are typically formed by forming and filling openings with copper within dielectric material, as known to one of ordinary skill in the art of integrated circuit fabrication. FIG. 1 for example shows a dual damascene interconnect structure of the prior art including a via portion 102 and a line portion 104 formed on an underlying interconnect structure 106. The background of the invention and an embodiment of the present invention are described in reference to a dual damascene interconnect structure. However, the problems of the prior art and aspects of the present invention may be generalized to any type of interconnect structure such as a via structure or a metal line structure formed individually.

The underlying interconnect structure 106 is formed within an underlying dielectric material 108 that is formed on a semiconductor substrate 110. The via portion 102 and the line portion 104 of the dual damascene interconnect structure are formed within an upper layer of dielectric material 112 formed on the underlying dielectric material 108. The semiconductor substrate 110 is typically comprised of silicon, and the upper layer of dielectric material 112 and the underlying dielectric material 108 are typically comprised of silicon dioxide (SiO$_2$) or a low-k dielectric material having a dielectric constant that is lower that the dielectric constant of silicon dioxide (SiO$_2$).

The dual damascene interconnect structure is formed by filling a dual damascene opening having both a via opening for forming the via portion 102 and a trench line opening for forming the line portion 104 of the dual damascene interconnect structure, as known to one of ordinary skill in the art of integrated circuit fabrication. Such a dual damascene opening is filled with a conductive material to form the via portion 102 and the line portion 104 of the dual damascene interconnect structure, as known to one of ordinary skill in the art of integrated circuit fabrication. The via portion 102 electrically couples the underlying interconnect structure 106 to the line portion 104 of the dual damascene interconnect structure, as known to one of ordinary skill in the art of integrated circuit fabrication.

In the case such a conductive fill material is comprised of copper, a diffusion barrier material 114 is also typically formed to surround such copper fill material to prevent the diffusion of copper into the surrounding dielectric material 112. Copper is a mid-bandgap impurity in silicon, silicon dioxide, and other dielectric materials. Thus, copper may diffuse easily into these common integrated circuit materials to degrade the circuit performance of integrated circuits. To prevent such undesired diffusion of copper, the diffusion barrier material 114 is deposited to surround the copper interconnect at the interface between the copper interconnect and the surrounding material 112, as known to one of ordinary skill in the art of integrated circuit fabrication.

Further referring to FIG. 1, in the case that the underlying interconnect structure 106 is also comprised of copper, a diffusion barrier material 116 is formed to surround the underlying interconnect structure 106 from the underlying dielectric material 108. The diffusion barrier material 116 at the interface between the underlying interconnect structure 106 and the underlying dielectric material 108 prevents diffusion of copper from the underlying interconnect structure 106 into the underlying dielectric material 108.

Also referring to FIG. 1, a dielectric capping layer 118 is formed on the underlying interconnect structure 106 to further encapsulate the copper of the underlying interconnect structure 106. Similarly, a dielectric passivation layer 120 is formed on top of the line portion 104 of the dual damascene interconnect structure for further encapsulating the copper of the dual damascene interconnect structure. The dielectric capping layer 118 and the dielectric passivation layer 120 for example are comprised of silicon nitride (SiN), and copper does not diffuse as easily through such a material of the dielectric capping layer 118 and the dielectric passivation layer 120.

However, even though copper of the underlying interconnect structure 106 does not diffuse easily into the dielectric capping layer 118, copper atoms migrate along the interface 122 between the dielectric capping layer 118 and the copper line 106. Similarly, even though copper of the line portion 104 of the dual damascene interconnect structure does not diffuse easily into the dielectric passivation layer 120, copper atoms migrate along the interface 124 between the dielectric passivation layer 120 and the copper line 104. The copper atoms migrate along such interfaces 122 and 124 and may cause voiding in copper lines potentially creating an open circuit, especially when a void is formed beneath the via 102. Thus, such migration of copper along the interfaces 122 and 124 contributes to electromigration failure of the interconnect structures 102, 104, and 106.

Thus, a mechanism is desired for minimizing migration of atoms of the conductive material of an interconnect structure along the interface at the bottom of a dielectric capping layer or dielectric passivation layer formed on the interconnect structure.

SUMMARY OF THE INVENTION

Accordingly, in a general aspect of the present invention, an interconnect structure is formed with a plurality of layers of a conductive material with a grain boundary between any two adjacent layers of the conductive material. Such grain boundaries between layers of conductive material act as shunt by-pass paths for migration of atoms of the conductive material to minimize migration of atoms of the conductive material along the interface between a dielectric passivation or capping layer and the interconnect structure.

In one embodiment of the present invention, the interconnect structure is a via structure, and each of the layers of the conductive material and each of the grain boundary are formed to be perpendicular to a direction of current flow through the via structure. Alternatively, the interconnect structure is a line structure, and each of the layers of the conductive material and each of the grain boundary are formed to be parallel to a direction of current flow through the line structure. In addition, when the interconnect structure is a line structure, each of the layers of the conductive material and each of the grain boundary may be formed to be parallel to a dielectric passivation or capping layer formed on the line structure.

Such layers of the conductive material and the grain boundary between adjacent layers of the conductive material may be formed by deposition of the conductive material in an electro-chemical deposition process within an electro-chemical deposition system. In that case, a first layer of the conductive material is deposited with an electro-chemical deposition bath of the electro-chemical deposition system for a first deposition time period. Deposition of the conductive material of the first layer of the conductive material is stopped for a rest time period after the first deposition time period. A second layer of the conductive material is deposited on the first layer of the conductive material with the electro-chemical deposition bath of the electro-chemical deposition system for a second deposition time period after the rest time period. The first and second layers of the conductive material formed with a rest time period in between such layers forms the interconnect structure with a grain boundary between the first and second layers of the conductive material.

In another embodiment of the present invention, a first layer of the conductive material is deposited with a first voltage signal having a first voltage wave-form used in the electro-chemical deposition system. A second layer of the conductive material is deposited on the first layer of the conductive material with a second voltage signal having a second voltage wave-form used in the electro-chemical deposition system. The first voltage wave-form of the first voltage signal is different from the second voltage wave-form of the second voltage signal. The first and second layers of the conductive material formed using different voltage signals form the interconnect structure with a grain boundary between the first and second layers of the conductive material.

In a further embodiment of the present invention, a first layer of the conductive material is deposited with a first electro-chemical deposition bath of the electro-chemical deposition system. A second layer of the conductive material is deposited on the first layer of the conductive material with a second electro-chemical deposition bath of the electro-chemical deposition system. A first composition of the first electro-chemical deposition bath is different from a second composition of the second electro-chemical deposition bath. The first and second layers of the conductive material formed with such baths having different compositions form the interconnect structure with a grain boundary between the first and second layers of the conductive material.

In yet another embodiment of the present invention, a first layer of the conductive material is deposited with a first electro-chemical deposition bath of the electro-chemical deposition system. A second layer of the conductive material is deposited on the first layer of the conductive material with a second electrochemical deposition bath of the electrochemical deposition system. A first temperature of the first electrochemical deposition bath is different from a second temperature of the second electro-chemical deposition bath. The first and second layers of the conductive material formed with such baths having different temperatures form the interconnect structure with a grain boundary between the first and second layers of the conductive material.

In a further embodiment of the present invention, a first layer of the conductive material is deposited with an electro-chemical deposition bath of the electro-chemical deposition system, and a thermal anneal is performed for the first layer of the conductive material. A second layer of the conductive material is deposited on the first layer of the conductive material with the electro-chemical deposition bath of the electro-chemical deposition system after the thermal anneal of the first layer of the conductive material. The first and second layers of the conductive material formed with a thermal anneal performed between deposition of such layers of conductive material form the interconnect structure with a grain boundary between the first and second layers of the conductive material.

In this manner, the grain boundaries formed between a plurality of layers of conductive material act as shunt by-pass paths for migration of atoms of the conductive material to minimize migration of atoms of the conductive material along the interface between a dielectric passivation or capping layer and the interconnect structure. In turn, electromigration failure of such an interconnect structure is minimized. In addition, the grain boundaries formed between the plurality of layers of conductive material in a via structure minimize charge carrier wind-force along the direction of current flow through the via structure to further minimize electromigration failure of the via structure.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, and 17 refer to elements having similar structure and function.

DETAILED DESCRIPTION

An embodiment of the present invention is described in reference to a dual damascene interconnect structure. However, aspects of the present invention may be used for forming any type of interconnect structure such as a via structure or a metal line structure formed individually, as would be apparent to one of ordinary skill in the art of integrated circuit fabrication from the description herein.

Figure 1:
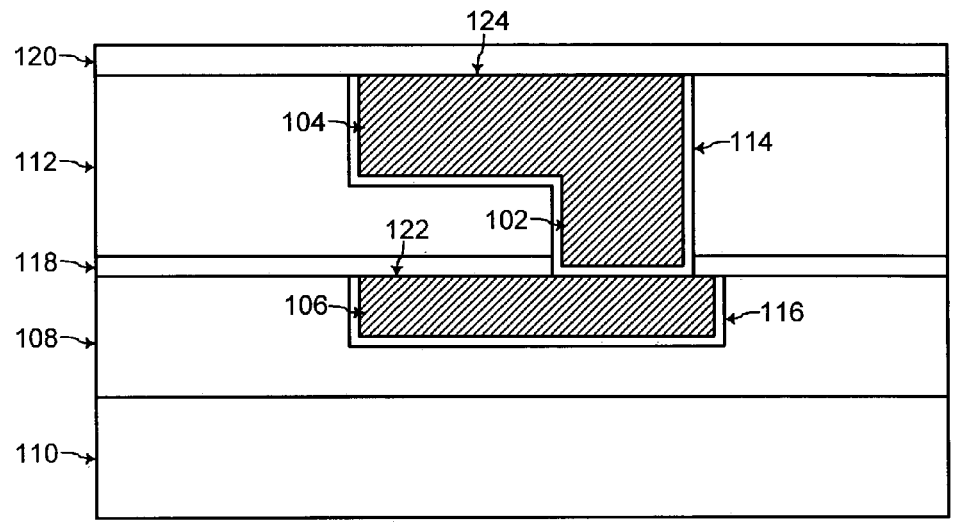
FIG. 1 shows a cross-sectional view of a dual damascene interconnect structure, according to the prior art.
Figure 2:
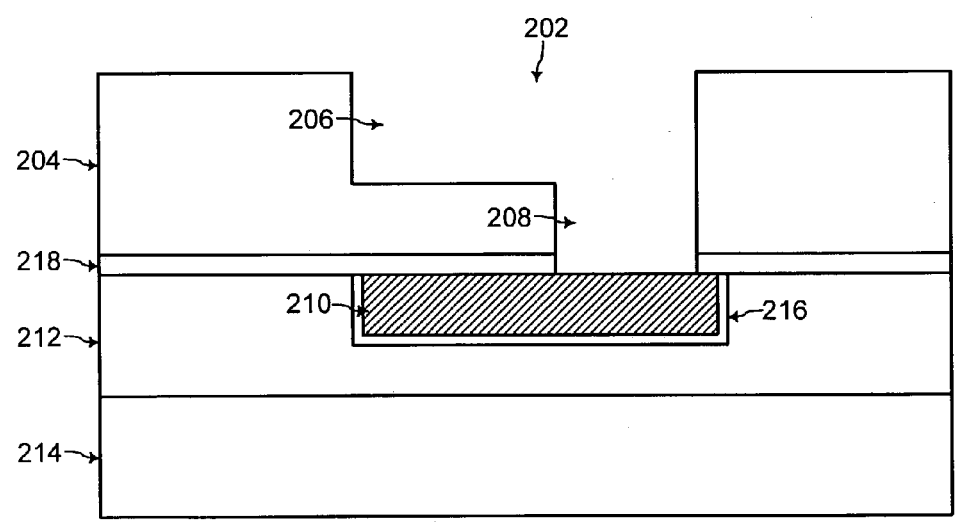
FIGS. 2, 3, 4, 5, and 6 show cross-sectional views for forming a dual damascene interconnect structure with a plurality of layers of conductive material with a grain boundary between adjacent layers of the conductive material, according to an embodiment of the present invention.

Referring to FIG. 2, a dual damascene opening 202 is formed within an upper dielectric layer 204. The dual damascene opening 202 includes an upper trench opening 206 and a lower via opening 208 formed on an underlying interconnect structure 210. The underlying interconnect structure 210 is formed within a lower dielectric layer 212 which is formed on a semiconductor substrate 214. In one embodiment of the present invention, the semiconductor substrate 214 is comprised of silicon, and the upper and lower dielectric layers 204 and 212 are comprised of silicon dioxide ($SiO_2$) or a low-k dielectric material having a dielectric constant lower than that of silicon dioxide ($SiO_2$).

When the underlying interconnect structure 210 is comprised of copper, a diffusion barrier material 216 is formed to surround the underlying interconnect structure 210 for preventing diffusion of copper from the underlying interconnect structure 210 into the surrounding lower dielectric layer 212. In addition, in that case, a capping layer 218 is formed on the underlying interconnect structure 210 for encapsulating copper of the underlying interconnect structure 210 from diffusing into the upper dielectric layer 204.

Figure 3:
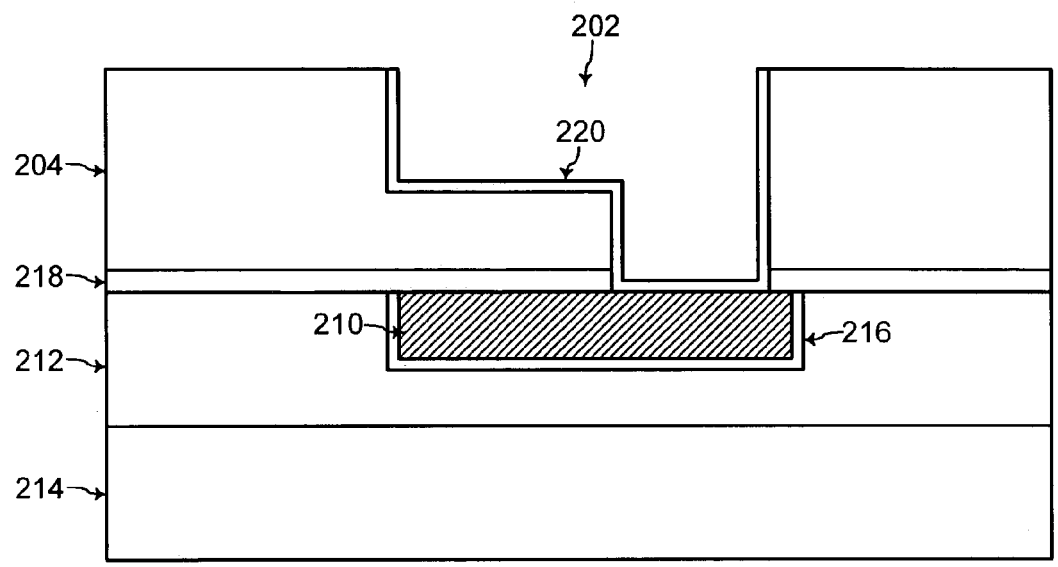

Processes for forming the dual damascene opening 202 comprised of the upper trench opening 206 and the lower via opening 208 within the upper dielectric layer 204 comprised of silicon dioxide ($SiO_2$) or a low-k dielectric material are known to one of ordinary skill in the art of integrated circuit fabrication. Referring to FIGS. 2 and 3, if the conductive material to be formed for filling the dual damascene opening 202 is comprised of copper, a diffusion barrier material 220 is deposited on the sidewalls of the dual damascene opening 202. Diffusion barrier materials and processes for depositing diffusion barrier materials are known to one of ordinary skill in the art of integrated circuit fabrication.

Figure 4:
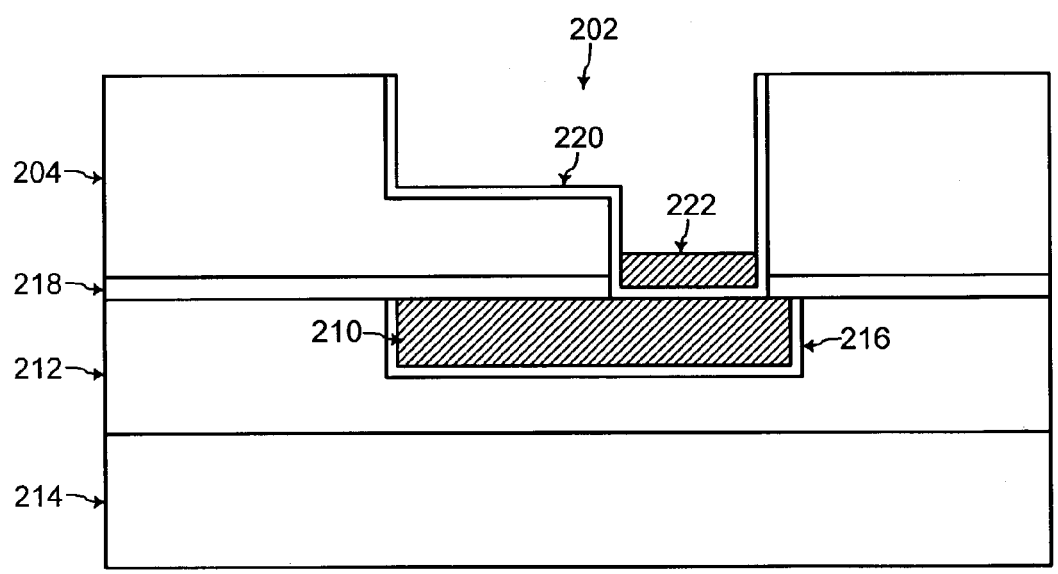
Figure 5:
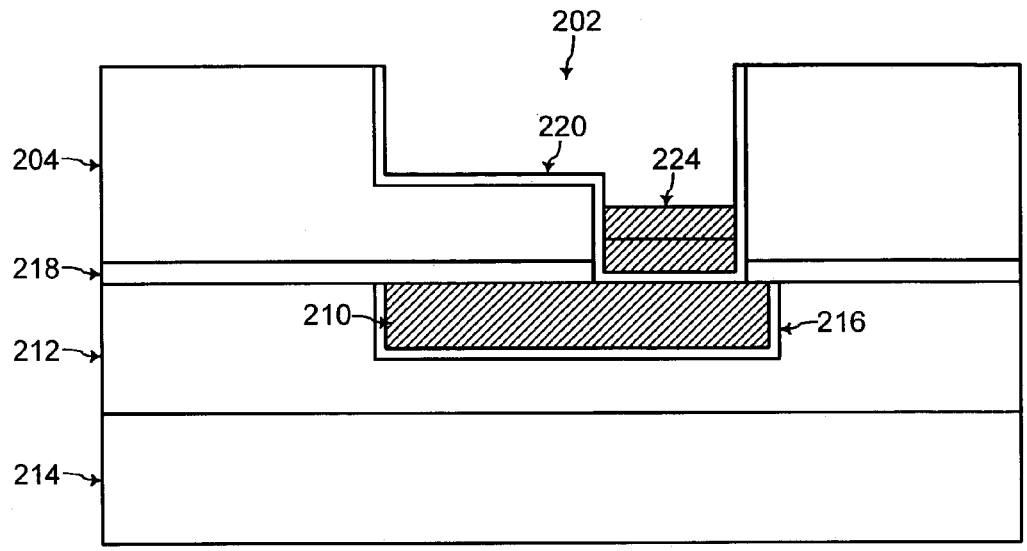
Figure 6:
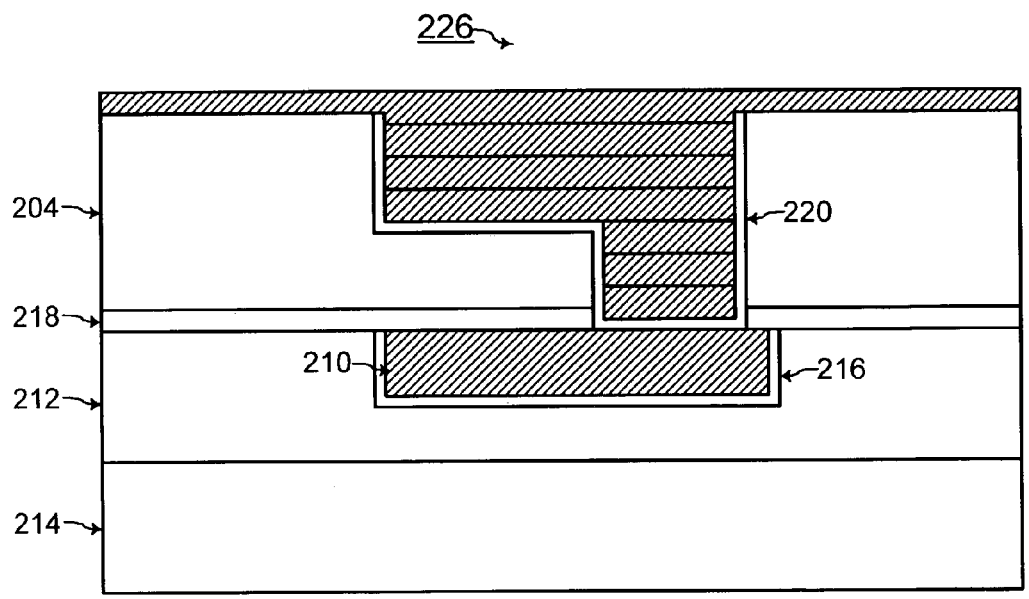

Referring to FIGS. 3 and 4, for filling the dual damascene opening 202 according to one embodiment of the present invention, a first layer of conductive material 222 is deposited at the bottom of the dual damascene opening 202. Referring to FIGS. 4 and 5, a second layer of conductive material 224 is deposited on the first layer of conductive material 222. Referring to FIGS. 5 and 6, a plurality of layers of conductive material are deposited to fill the dual damascene opening 202 for forming a dual damascene interconnect structure 226. In addition, a grain boundary is formed between any two adjacent layers of the plurality of layers of conductive material.

In one embodiment of the present invention, the plurality of layers of conductive material filling the dual damascene opening 202 are comprised of copper for example. However, the present invention may be practiced when the plurality of layers of conductive material filling the dual damascene opening 202 are comprised of any other type of conductive material, as would be apparent to one of ordinary skill in the art of integrated circuit fabrication from the description herein.

Figure 7:
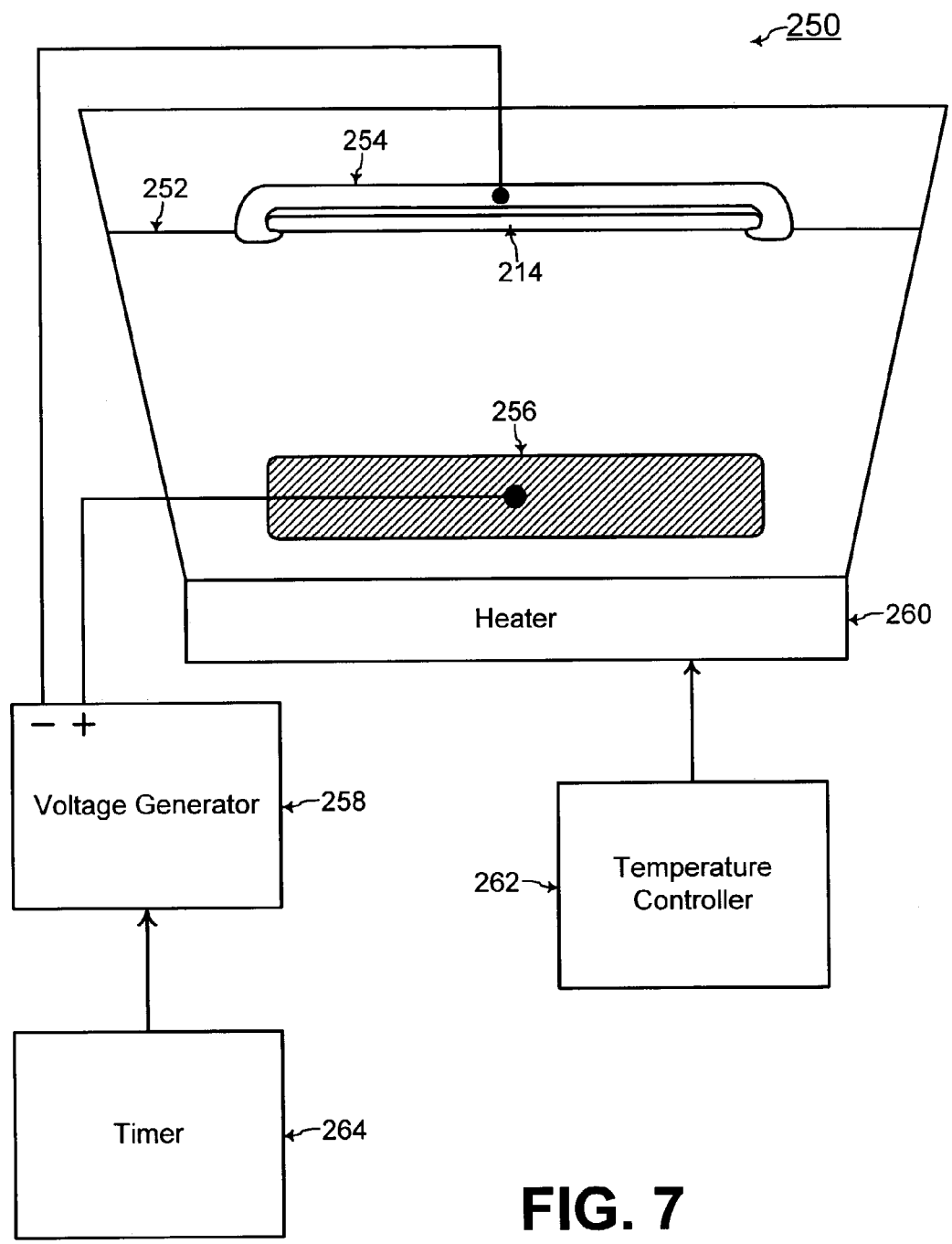
FIG. 7 shows components of a system for forming the plurality of layers of conductive material of FIGS. 4, 5, and 6 by having a rest period between deposition of adjacent layers of conductive material, according to an embodiment of the present invention.

FIG. 7 shows an electro-chemical deposition system 250 for forming the plurality of layers of conductive material filling the dual damascene opening 202. The electro-chemical deposition system 250 includes an electro-chemical deposition bath 252, a wafer holder 254 for holding the semiconductor wafer 214, and a copper anode 256. The electro-chemical deposition system 250 further includes a voltage generator 258 used for generating a voltage signal applied between the wafer holder 254 and the copper anode 256 within the electrochemical deposition bath 252.

Typically, when the conductive material to be formed for filling the dual damascene opening 202 is comprised of copper, the electro-chemical deposition bath 252 includes copper ions, as known to one of ordinary skill in the art of integrated circuit fabrication. Such an electro-chemical deposition bath 252 is commercially available and known to one of ordinary skill in the art of integrated circuit fabrication. The copper anode 256 is coupled to the positive node for the voltage signal generated by the voltage generator 258. The wafer holder 254 is the cathode when the negative node for the voltage signal generated by the voltage generator 258 is coupled to the wafer holder 254.

In addition, the electro-chemical deposition bath 252 sits on a heater 260 for heating the electro-chemical deposition bath 252. A temperature controller 262 is coupled to the heater 260 for maintaining the temperature of the electro-chemical deposition bath 252 at a desired temperature. In addition, a timer 264 is coupled to the voltage generator 258 for applying the voltage signal from the voltage generator 258 across the copper anode 256 and the wafer holder 254 for a predetermined time period. The components of the voltage generator 258, the heater 260, the temperature controller 262, and the timer 264 are individually known to one of ordinary skill in the art of electronics.

Referring to FIGS. 3 and 7, for deposition of copper on the semiconductor wafer 214 for filling the dual damascene opening 202, the surface of the semiconductor wafer 214 with the dual damascene opening 202 formed thereon is placed onto the meniscus of the electro-chemical deposition bath 252 by the wafer holder 254. When the voltage signal from the voltage generator 258 is applied across the copper anode 256 and the wafer holder 254, the semiconductor wafer 214 becomes the cathode, and copper is deposited on conductive surfaces of the semiconductor wafer 214 placed onto the meniscus of the electro-chemical deposition bath 252 including at the bottom of the dual damascene opening 202.

Referring to FIGS. 4 and 7, a voltage signal from the voltage signal generator 258 is applied for a first time period as timed by the timer 264 between the copper anode 256 and the wafer holder 254. During such a first time period, the first layer of copper 222 is deposited at the bottom of the dual damascene opening 202. After such a first time period for depositing the first layer of copper 222 at the bottom of the dual damascene opening 202, the voltage signal generator 258 is turned off for a rest time period as timed by the timer 264. When the voltage signal generator 258 is turned off, a voltage signal is not applied between the copper anode 256 and the wafer holder 254 such that deposition of copper within the dual damascene opening 202 is stopped for the rest time period. During such a rest time period, organic additive molecules within the electro-chemical deposition bath 252 may adsorb on the first layer of copper 222. Such organic additive molecules within commercially available electrochemical deposition baths for deposition of copper are known to one of ordinary skill in the art of integrated circuit fabrication.

Referring to FIGS. 4, 5, and 7, after the rest time period, the voltage signal from the voltage signal generator 258 is applied again between the copper anode 256 and the wafer holder 254 for deposition of the second layer of copper 224 on the first layer of copper 222. During the rest time period before the second time period for deposition of the second layer of copper 224, organic additive molecules within the electro-chemical deposition bath 252 were adsorbed on the first layer of copper 222. Such organic additive molecules on the surface of the first layer of copper 222 induce a new grain boundary for the second layer of copper 224 formed after the rest time period such that a grain boundary is formed between the first and second layers of copper 222 and 224.

Referring to FIGS. 6 and 7, such a process of having a rest time period between layers of copper deposited with the electro-chemical deposition bath 252 is repeated for deposition of the plurality of layers of copper for filling the dual damascene opening 202. Thus, a grain boundary is formed between any two adjacent layers of copper formed with the electro-chemical deposition bath 252.

Figure 8:
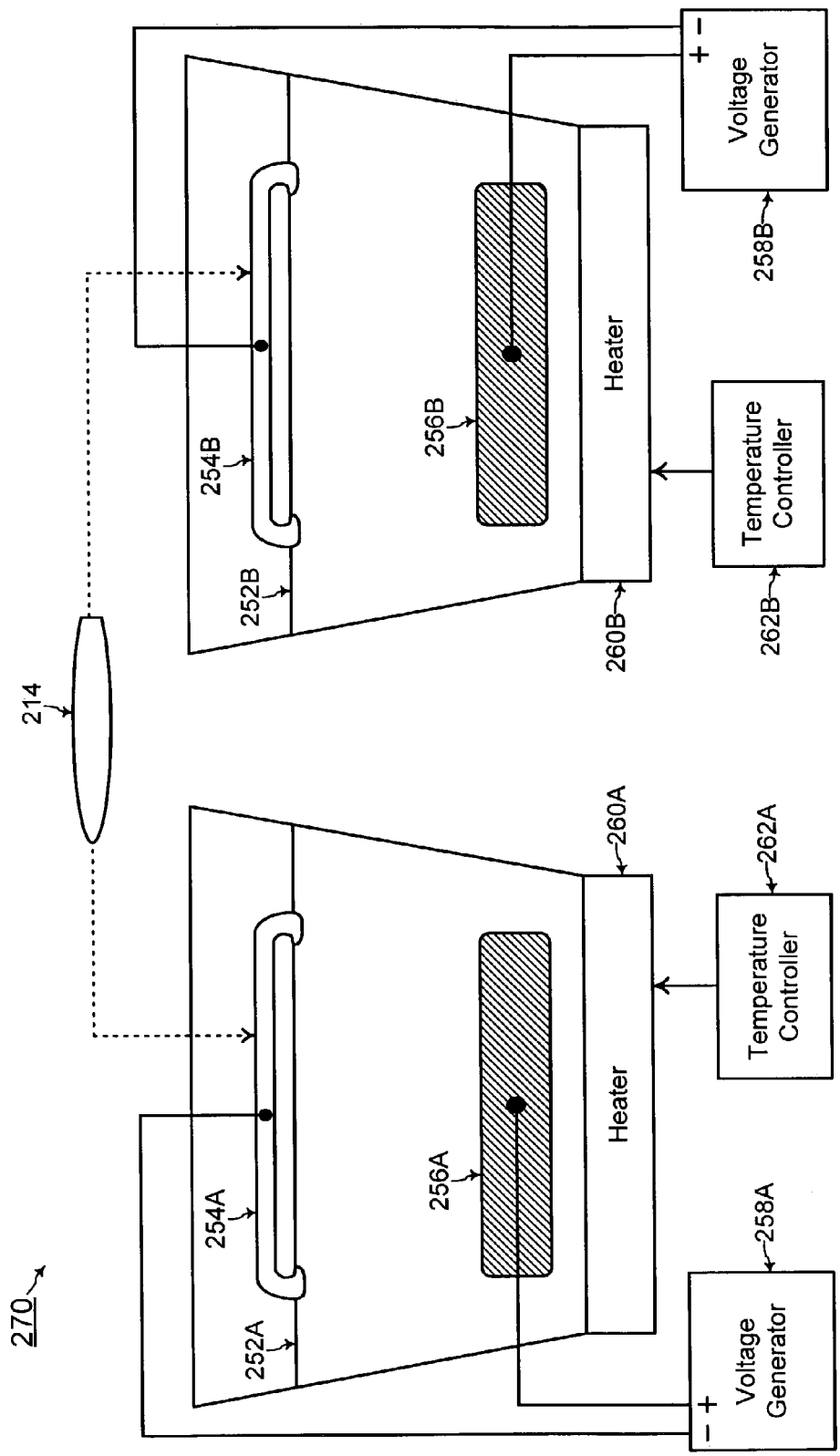
FIG. 8 shows components of a system for forming the plurality of layers of conductive material of FIGS. 4, 5, and 6 by using two different electro-chemical deposition baths, according to an embodiment of the present invention.

FIG. 8 shows an electrochemical deposition system 270 for deposition of the plurality of layers of conductive material for filling the dual damascene opening 202 according to another embodiment of the present invention. The electro-chemical deposition system 270 includes a first electro-chemical deposition bath 252A and a second electro-chemical deposition bath 252B. The first electro-chemical deposition bath 252A correspondingly includes a first wafer holder 254A, a first copper anode 256A, a first voltage generator 258A, a first heater 260A, and a first temperature controller 262A, similarly as described for such components of FIG. 7. In addition, the second electro-chemical deposition bath 252B correspondingly includes a second wafer holder 254B, a second copper anode 256B, a second voltage generator 258B, a second heater 260B, and a second temperature controller 262B, similarly as described for such components of FIG. 7.

Referring to FIGS. 4 and 8, the semiconductor wafer 214 having the dual damascene opening 202 formed thereon is placed within the first wafer holder 254A and is placed onto the meniscus of the first electro-chemical deposition bath 252A. When a first voltage signal from the first voltage generator 258A is applied between the first copper anode 256A and the first wafer holder 254A, a first layer of copper 222 is deposited at the bottom of the dual damascene opening 202.

Referring to FIGS. 4, 5, and 8, after deposition of the first layer of copper 222 at the bottom of the dual damascene opening 202 with the first electro-chemical deposition bath 252A, the semiconductor wafer 214 is removed from the first electro-chemical deposition bath 252A and placed within the second wafer holder 254B and onto the meniscus of the second electrochemical deposition bath 252B. When a second voltage signal from the second voltage generator 258B is applied between the second copper anode 256B and the second wafer holder 254B, a second layer of copper 224 is deposited on the first layer of copper 222.

In this manner, a grain boundary is formed between the first layer of copper 222 and the second layer of copper 224 when the bath conditions of the first and second electro-chemical deposition baths 252A and 252B are different. For example, the first and second electro-chemical deposition baths 252A and 252B may have different compositions such as different reactant concentrations for example. With such different reactant concentrations, the first and second layers of copper 222 and 224 have different impurity concentrations and different crystalline structures such that a grain boundary is induced between the first and second layers of copper 222 and 224.

Alternatively, the temperatures of the first and second electro-chemical deposition baths 252A and 252B are different. The first temperature controller 262A controls the first heater 260A to maintain a first temperature for the first electrochemical deposition bath 252A, and the second temperature controller 262B controls the second heater 260B to maintain a second temperature for the second electrochemical deposition bath 252B. With such different temperatures, the first and second layers of copper 222 and 224 have different crystalline structures such that a grain boundary is induced between the first and second layers of copper 222 and 224.

Figure 9:
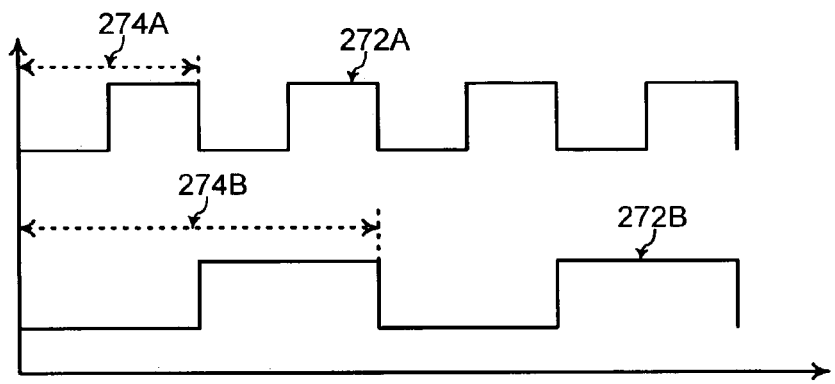
FIGS. 9, 10, 11, and 12 show examples of different voltage signals that may be used for depositing adjacent layers of conductive material of FIGS. 4, 5, and 6, according to an embodiment of the present invention.

Or, the voltage signals applied from the first and second voltage generators 258A and 258B have different waveforms for the first and second electro-chemical deposition baths 252A and 252B. Referring to FIGS. 8 and 9, a first voltage signal 272A has a first wave-form as generated by the first voltage signal generator 258A and is applied across the first copper anode 256A and the first wafer holder 254A of the first electro-chemical deposition bath 252A. Similarly, a second voltage signal 272B has a second wave-form as generated by the second voltage signal generator 258B and is applied across the second copper anode 256B and the second wafer holder 254B of the second electro-chemical deposition bath 252B.

Figure 10:
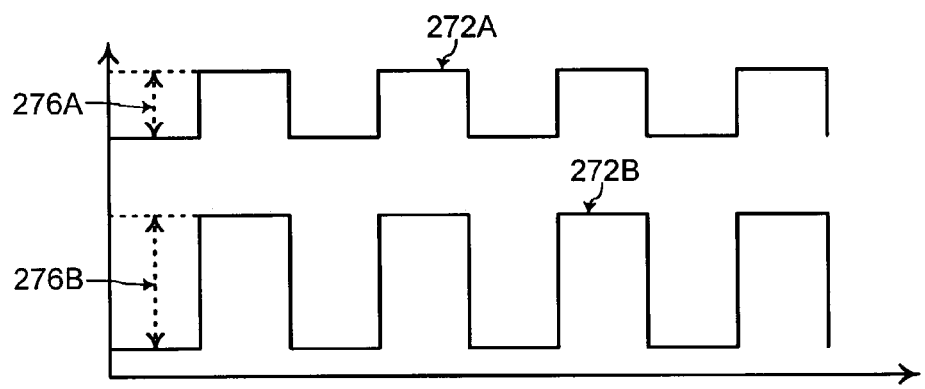
Figure 11:
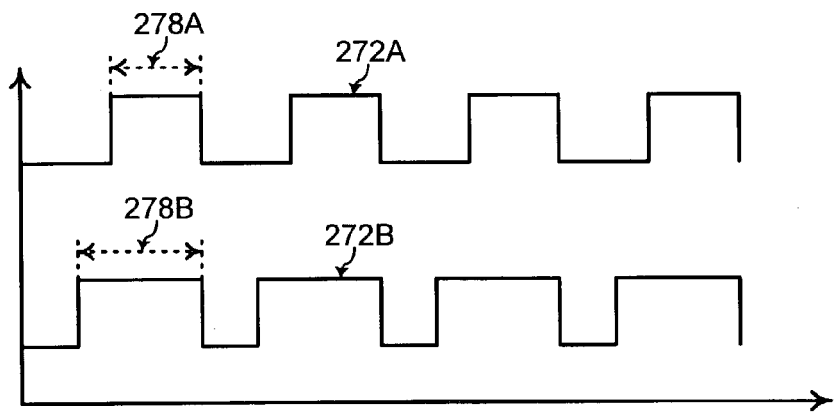
Figure 12:
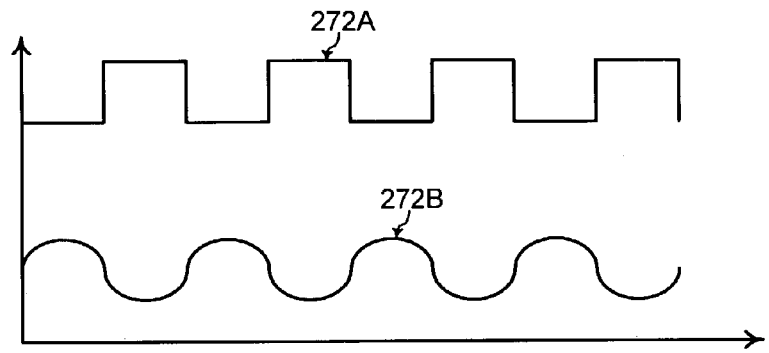

Referring to FIG. 9, the first voltage signal 272A from the first voltage signal generator 258A has a first time period 274A that is smaller than a second time period 274B of the second voltage signal 272B from the second voltage signal generator 258B. Alternatively, referring to FIG. 10, the first voltage signal 272A has a first amplitude 276A that is smaller than a second amplitude 276B of the second voltage signal 272B. Or, referring to FIG. 11, the first voltage signal 272A has a first duty cycle 278A (when the first voltage wave-form is at a higher voltage) that is smaller than a second duty cycle 278B (when the second voltage wave-form is at a higher voltage) of the second voltage signal 272B. Referring to FIG. 12, the first voltage signal 272A has a square wave-form shape, whereas the second voltage signal 272B has a sine wave-form shape.

In any case, with such different wave-forms of the first and second voltage signals 272A and 272B applied for the first and second electro-chemical deposition baths 252A and 252B, the first and second layers of copper 222 and 224 formed with the first and second electro-chemical deposition baths 252A and 252B, respectively, have different crystalline structures such that a grain boundary is induced between the first and second layers of copper 222 and 224. Alternatively, referring to FIGS. 7, 9, 10, 11, and 12, one electro-chemical deposition system 250 may be used with the voltage signal generator 258 being programmed to alternately apply the first and second voltage signals 272A and 272B.

Referring to FIGS. 6 and 8, such a process of alternating between the first and second electro-chemical deposition baths 252A and 252B for deposition of the two layers of copper is repeated for deposition of the plurality of layers of copper for filling the whole dual damascene opening 202. Thus, a grain boundary is formed between any two adjacent layers of copper formed by alternating between the first and second electro-chemical deposition baths 252A and 252B.

Figure 13:
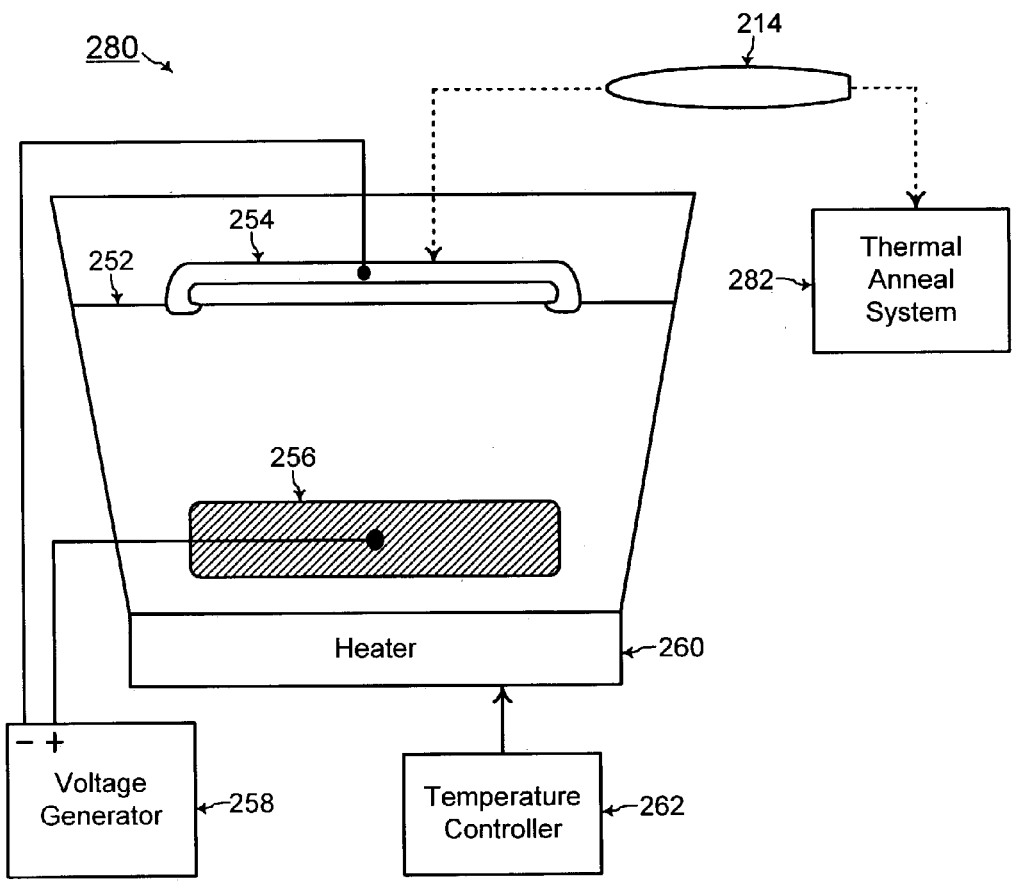
FIG. 13 shows components of a system for forming the plurality of layers of conductive material of FIGS. 4, 5, and 6 by performing a thermal anneal after deposition of each layer of conductive material, according to an embodiment of the present invention.

FIG. 13 shows an electrochemical deposition system 280 for deposition of the plurality of layers of conductive material for filling the dual damascene opening 202 according to another embodiment of the present invention. The electro-chemical deposition system 280 includes the electrochemical deposition bath 252, the wafer holder 254, the copper anode 256, the voltage signal generator 258, the heater 260, and the temperature controller 262, similarly as already described in reference to FIG. 7. The electrochemical deposition system 280 of FIG. 13 also includes a thermal anneal unit 282 for performing a thermal anneal after deposition of each layer of conductive material within the dual damascene opening 202.

Referring to FIGS. 4 and 13, after deposition of the first layer of copper 222 with the electrochemical deposition bath 252, the semiconductor wafer 214 is placed within the thermal anneal unit 282 for annealing the first layer of copper 222 before any subsequent layer of copper is deposited thereon. The thermal anneal unit 282 is a (RTA) rapid thermal anneal unit whereby the semiconductor wafer is placed on a hot plate (instead of a furnace thermal anneal unit) for a shorter anneal time. Such a thermal anneal unit 282 is individually known to one of ordinary skill in the art of integrated circuit fabrication.

Referring to FIGS. 5 and 13, after performing a thermal anneal on the first layer of copper 222, the semiconductor wafer 214 is placed back within the wafer holder 254 of the electrochemical deposition bath 252 for deposition of the second layer of copper 224. Because of the thermal anneal performed on the first layer of copper 222 before deposition of this second layer of copper 224, a grain boundary is formed between the first and second layers of copper 222 and 224. After deposition of the second layer of copper 224 within the electrochemical deposition bath 252, the semiconductor wafer 214 is placed within the thermal anneal unit 282 for annealing the second layer of copper 224 before any subsequent layer of copper is deposited thereon.

Referring to FIGS. 6 and 13, such a process of alternating between deposition of a layer of copper with the electro-chemical deposition bath 252 and annealing the layer of copper within the thermal anneal unit 282 is repeated until the whole dual damascene opening 202 is filled with the plurality of layers of copper. In addition, such a process of alternating between deposition of a layer of copper with the electrochemical deposition bath 252 and annealing the layer of copper within the thermal anneal unit 282 forms a grain boundary between any two adjacent layers of the plurality of layers of copper filling the dual damascene opening 202.

Figure 14:
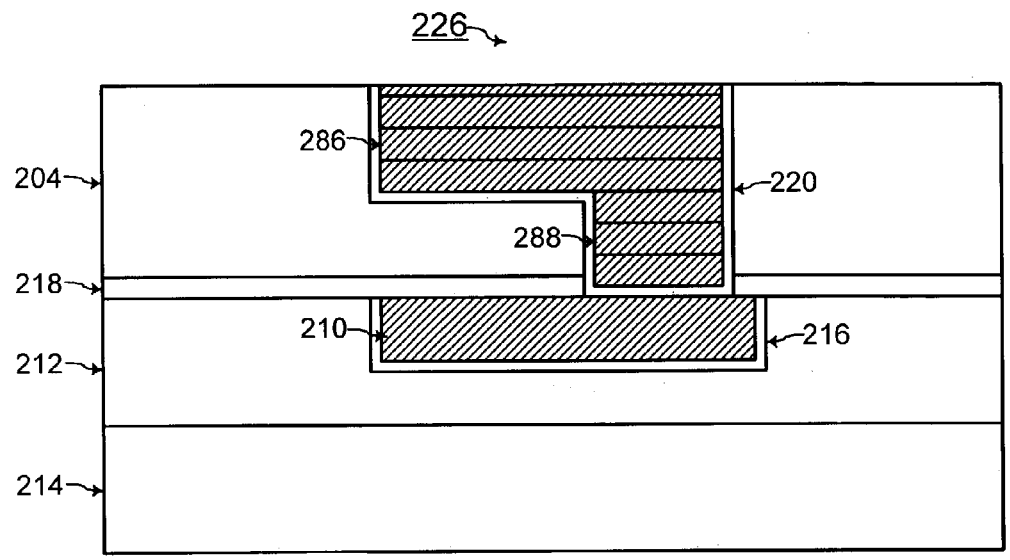
FIGS. 14 and 15 show cross-sectional views for forming the dual damascene interconnect structure with the plurality of layers of conductive material of FIG. 6 including forming a dielectric passivation layer on top of the line portion of the dual damascene interconnect structure, according to an embodiment of the present invention.

Referring to FIGS. 6 and 14, the conductive material on the upper dielectric layer 204 is polished away until the upper dielectric layer 204 is exposed such that the layers of conductive material are contained within the dual damascene opening 202 to form the dual damascene interconnect structure 226. Processes such as CMP (chemical mechanical polishing) processes are known to one of ordinary skill in the art of integrated circuit fabrication. Referring to FIGS. 2 and 14, the layers of conductive material filling the via opening 208 form a via structure 288, and the layers of conductive material filling the trench opening 206 form a line structure 286. The via structure 288 electrically couples the line structure 286 to the underlying interconnect structure 210.

Figure 15:
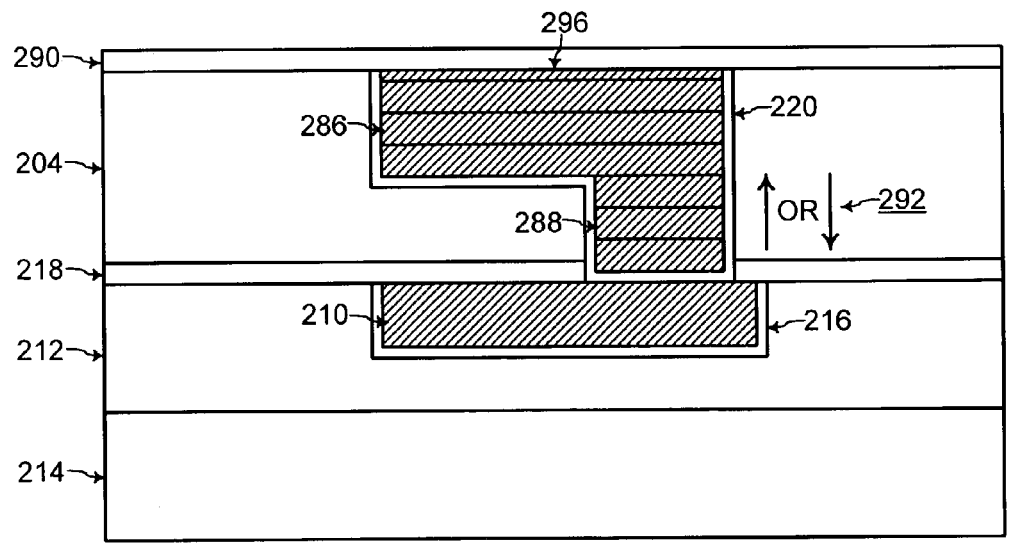

Referring to FIGS. 14 and 15, a passivation layer 290 is deposited on the line structure 286 and on the upper dielectric layer 204 to encapsulate the line structure 286. The passivation layer 290 is comprised of silicon nitride (SiN) according to one embodiment of the present invention. Processes for deposition of such a passivation layer 290 are known to one of ordinary skill in the art of integrated circuit fabrication.

Figure 16:
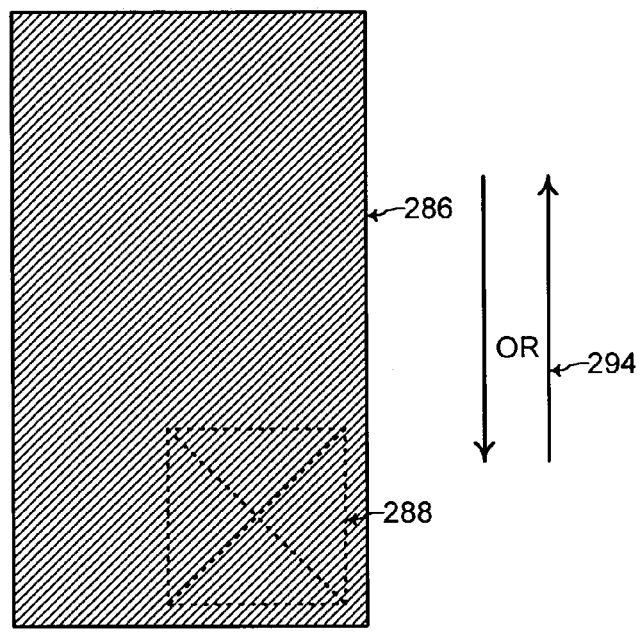
FIG. 16 shows a top view of the dual damascene interconnect structure of FIG. 14 for illustrating that the plurality of layers of conductive material are formed to be parallel with direction of current flow through the line portion of the dual damascene interconnect structure, according to an embodiment of the present invention.

FIG. 16 shows a top view of the line structure 286 and the via structure 288 formed with the layers of conductive material. The via structure 288 is outlined in dashed lines in FIG. 16 since the via structure 288 is disposed below the line structure 288. Referring to FIGS. 15 and 16, note that the direction of current flow through the via structure 288 is either up or down the via structure 288. Thus, the direction of current flow through the via structure 288 is perpendicular to the layers of conductive material and the grain boundaries formed within the via structure 288 (as illustrated by the arrows 292 in FIG. 15). In addition, referring to FIG. 16, note that the direction of current flow through the line structure 286 is parallel with the layers of conductive material and the grain boundaries formed within the line structure 286 (as illustrated by the arrows 294 in FIG. 16).

In this manner, because the direction of current flow through the via structure 288 is perpendicular to the layers of conductive material and the grain boundaries formed within the via structure 288, the grain boundaries formed between the plurality of layers of conductive material in the via structure 288 minimize charge carrier wind-force along the direction of current flow through the via structure 288 to minimize electromigration failure of the via structure 288. In addition, the grain boundaries formed between the plurality of layers of conductive material in the line structure 286 act as shunt by-pass paths for migration of atoms of the conductive material to minimize migration of atoms of the conductive material along the interface 296 between the dielectric passivation layer 290 and the line structure 286, especially since the grain boundaries and the layers of conductive material are formed to be parallel with the dielectric passivation layer 290. Thus, electromigration failure of the dual damascene interconnect structure 226 including the line structure 286 and the via structure 288 is advantageously minimized.

The foregoing is by way of example only and is not intended to be limiting. Any specified material or any specified dimension of any structure described herein is by way of example only. For example, the present invention may be used when the dual damascene opening 202 is filled with layers of any type of conductive material aside from the example of copper. Furthermore, an embodiment of the present invention is described in reference to a dual damascene interconnect structure. However, aspects of the present invention may be used for forming any type of interconnect structure such as a via structure or a metal line structure formed individually, as would be apparent to one of ordinary skill in the art of integrated circuit fabrication from the description herein.

Figure 17:
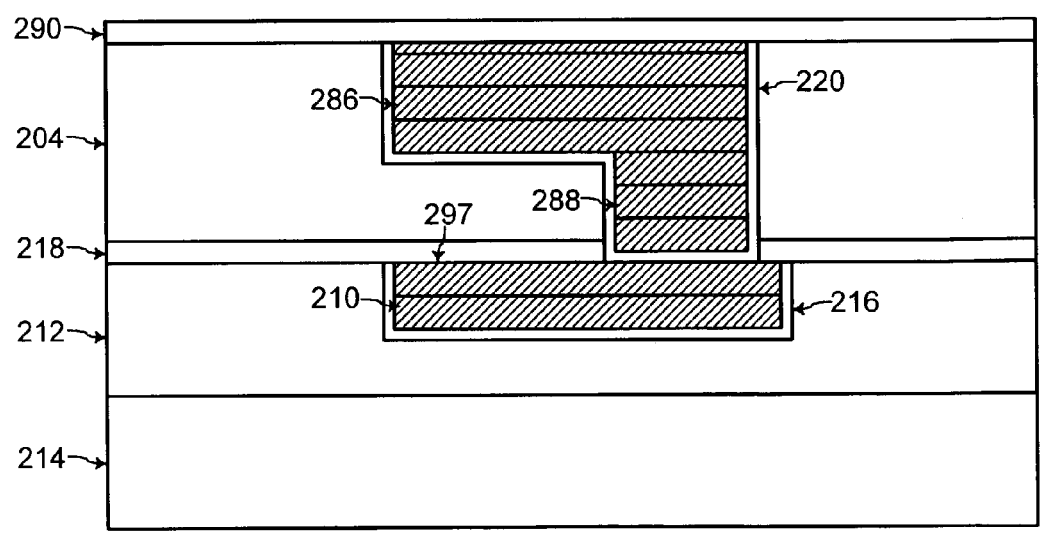
FIG. 17 shows a cross-sectional view for forming a plurality of layers of conductive material for an underlying interconnect structure formed at the bottom of the dual damascene interconnect structure of FIG. 15, according to an embodiment of the present invention.

For example, referring to FIG. 17, the underlying interconnect structure 210 may also be formed with layers of copper fabricated in processes as described herein in reference to FIGS. 7, 8, and 13. When the underlying interconnect structure 210 is a line structure, the grain boundaries and the layers of copper are parallel with the dielectric capping layer 218. Such grain boundaries between the layers of copper forming the underlying metal structure 210 act as shunt by-pass paths for migration of atoms of the copper of the underlying metal structure 210 to minimize migration of such copper atoms along the interface 297 between the dielectric capping layer 218 and the underlying interconnect structure 210.

In addition, as will be understood by those skilled in the art, the structures described herein may be made or used in the same way regardless of their position and orientation. Accordingly, it is to be understood that terms and phrases such as "below," "on," and "underlying" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

The invention claimed is:

1. A method for forming an interconnect structure, comprising the steps of:
    forming a first layer of conductive material of the interconnect structure;
    forming a second layer of the conductive material adjacent the first layer with a grain boundary between the first and second layers; and
    performing a grain boundary inducing step after formation of the first layer and before formation of the second layer;
    wherein the grain boundary inducing step includes stopping deposition of the first layer within an electro-chemical deposition bath for a rest time period before deposition of the second layer within the electro-chemical deposition bath.

2. The method of claim 1, wherein organic additives within the electro-chemical deposition bath adsorb on the first layer during the rest time period to induce the grain boundary between the first and second layers.

3. A method for forming an interconnect structure, comprising the steps of:
    A. forming a first layer of conductive material of the interconnect structure;
    B. forming a second layer of the conductive material adjacent the first layer with a grain boundary between the first and second layers; and
    C. forming the first and second layers of the conductive material and the grain boundary substantially along planes that are parallel to each-other;
    wherein the first layer is formed within an electro-chemical deposition bath having first properties, and wherein the second layer is formed within an electro-chemical deposition bath having second properties different from the first properties.

4. A method for forming an interconnect structure, comprising the steps of:
    forming a first layer of conductive material of the interconnect structure; and
    forming a second layer of the conductive material adjacent the first layer with a grain boundary between the first and second layers;
    wherein the first layer is formed within an electro-chemical deposition bath having first properties, and wherein the second layer is formed within an electro-chemical deposition bath having second properties different from the first properties;
    and wherein a first voltage signal having a first voltage wave-form used for forming the first layer is different from a second voltage signal having a second voltage wave-form used for forming the second layer.

5. The method of claim 4, wherein at least one of amplitude, period, duty cycle, or wave-form shape of the first voltage wave-form is different from that of the second voltage wave-form.

6. The method of claim 3, wherein a first composition of a first electro-chemical deposition bath for forming the first layer is different from a second composition of a second electro-chemical deposition bath for forming the second layer.

7. The method of claim 3, wherein a first temperature of a first electro-chemical deposition bath for forming the first layer is different from a second temperature of a second electro-chemical deposition bath for forming the second layer.

8. The method of claim 3, further including the steps of:
    forming a dielectric material that surrounds the interconnect structure; and
    forming a dielectric passivation or capping layer on top of the interconnect structure.

9. The method of claim 3, wherein the interconnect structure is a via structure, the method further including the step of:
    forming the first and second layers and the grain boundary to be perpendicular to a direction of current flow through the via structure.

10. The method of claim 3, wherein the interconnect structure is a line structure, the method further including the step of:
    forming the first and second layers and the grain boundary to be parallel to a direction of current flow through the line structure.

11. The method of claim 3, wherein the interconnect structure is a line structure, the method further including the step of:
    forming the first and second layers and the grain boundary to be parallel to a dielectric passivation or capping layer formed on the line structure.

12. The method of claim 3, wherein the interconnect structure is formed by deposition of the first and second layers within an interconnect opening formed within a dielectric material.

13. The method of claim 12, wherein the interconnect opening is a dual damascene opening.

14. The method of claim 3, wherein the conductive material for forming the interconnect structure is copper.

\* \* \* \* \*